United States Patent [19]

Thomson

[11] Patent Number: 5,292,605
[45] Date of Patent: * Mar. 8, 1994

[54] METHOD FOR CONTROL OF PHOTORESIST DEVELOP PROCESSES

[75] Inventor: Mariste A. Thomson, Santa Clara, Calif.

[73] Assignee: Xinix, Inc., Santa Clara, Calif.

[ * ] Notice: The portion of the term of this patent subsequent to Mar. 23, 2010 has been disclaimed.

[21] Appl. No.: 957,660

[22] Filed: Oct. 7, 1992

Related U.S. Application Data

[63] Continuation of Ser. No. 526,639, May 18, 1990, Pat. No. 5,196,285.

[51] Int. Cl.$^5$ .............................................. G03C 5/00
[52] U.S. Cl. ...................................... 430/30; 430/311; 354/298; 354/317; 354/325; 156/626
[58] Field of Search ................ 430/30, 311; 354/298, 354/317, 325; 156/626

[56] References Cited

U.S. PATENT DOCUMENTS

| | | | |
|---|---|---|---|
| 4,136,940 | 4/1979 | Lin | 354/298 |
| 4,142,107 | 7/1979 | Hatzakis et al. | 430/30 |
| 4,198,261 | 9/1980 | Busta et al. | 356/364 |
| 4,317,698 | 5/1982 | Christol et al. | 156/639 |
| 4,462,860 | 3/1984 | Szmanda | 430/30 |
| 4,469,424 | 2/1984 | Matsui et al. | 354/298 |
| 4,479,848 | 10/1984 | Otsubo et al. | 156/626 |
| 4,496,425 | 1/1985 | Kuyel | 156/626 |
| 4,501,480 | 1/1985 | Matsui et al. | 354/298 |
| 4,564,280 | 10/1986 | Fukuda | 354/317 |
| 4,569,717 | 2/1986 | Ohgami et al. | 430/30 |
| 4,611,919 | 9/1986 | Brooks, Jr. et al. | 356/357 |
| 4,618,262 | 10/1986 | Maydan et al. | 356/357 |
| 4,647,172 | 3/1987 | Batchelder et al. | 430/30 |
| 4,717,446 | 1/1988 | Nagy et al. | 156/626 |
| 4,851,311 | 10/1989 | Millis et al. | 430/30 |
| 4,851,311 | 7/1989 | Millis et al. | 430/30 |
| 4,857,430 | 11/1989 | Millis et al. | 430/30 |
| 4,922,277 | 4/1990 | Carlson et al. | 354/317 |
| 4,953,982 | 9/1990 | Ebbing et al. | 356/357 |
| 4,972,072 | 11/1990 | Hauser et al. | 356/357 |
| 4,982,215 | 5/1991 | Matsuoka | 354/325 |
| 4,998,021 | 3/1991 | Mimasaka | 156/626 |
| 5,077,464 | 12/1991 | Ebbing et al. | 250/566 |
| 5,151,584 | 9/1992 | Ebbing et al. | 250/201.4 |
| 5,166,525 | 11/1992 | Rodgers et al. | 250/338.1 |
| 5,190,614 | 3/1993 | Leach et al. | 156/626 |
| 5,196,285 | 3/1993 | Thomson | 430/30 |

FOREIGN PATENT DOCUMENTS

| | | | |
|---|---|---|---|
| 57-106030 | 4/1982 | Japan . | |
| 59-22330A | 8/1984 | Japan | 430/30 |
| 61-1156125 | 1/1986 | Japan . | |
| 1-228127 | 3/1988 | Japan | 430/30 |
| 1-298356 | 7/1989 | Japan . | |
| WO8304320 | 6/1983 | PCT Int'l Appl. | 430/30 |

OTHER PUBLICATIONS

Moritz, "Real-Time Photoresist Development Control", *IBM Technical Disclosure* vol. 19, No. 11, p. 4232 Apr. 1977.

Primary Examiner—Charles L. Bowers, Jr.
Assistant Examiner—Thomas R. Neville
Attorney, Agent, or Firm—Majestic, Parsons, Siebert & Hsue

[57] ABSTRACT

A method for the control of photoresist develop processes employing multiple spray-puddle steps in which process changes other than time, such as endpoint are used to determine the length of the spray and puddle steps.

14 Claims, 5 Drawing Sheets

METHOD FOR CONTROL OF PHOTORESIST DEVELOP PROCESSES

This is a continuation of application Ser. No. 07/526,639 filed May 18, 1990, now issued as U.S. Pat. No. 5,196,285.

BACKGROUND OF THE INVENTION

1. Field of the Invention

This invention relates generally to the use of optical devices to sense the progress of processes, transmit signals related to such progress, detect such signals and extract from such signals information to control such processes. More particularly, this invention relates to the use of an endpoint controller to control photoresist development in a multiple spray-puddle process for the fabrication of micro-electronic devices, including, but not limited to semiconductor devices.

2. Brief Description of the Prior Art

Photolithography makes it possible to transfer a desired circuit pattern to a surface of a semiconductor device. In a simplified photolithograpic process a silicon or gallium arsenide wafer or other substrate with a suitable substrate coating such as silicon dioxide, polysilicon, or aluminum or other metal is coated with a photoresist film and then subjected to an imaging and developing process which exposes regions of the substrate coating in a pattern defined by a mask having opaque and transparent portions positioned to form the desired pattern. The wafer is then etched by a subsequent process in the pattern formed by the developing process.

To maximize the yield of useful devices, the photolithography process must be controlled and certain dimensions, known as critical dimensions, kept within specified ranges.

The point at which photolithographic reactions proceed far enough to expose the underlying material or film is commonly called endpoint. However, for reasons which will become apparent that point is more accurately called breakthrough.

The use of devices to detect the breakthrough point in the photoresist development phase of the manufacturing process has been shown to significantly improve critical dimension control. This approach has been successfully used with constant spray processes and with spray-puddle processes(processes within which a developer is first sprayed upon the wafer and then allowed to puddle on the surface of the wafer) with a short spray period. A short spray period is defined as a spray period that consistently ends prior to breakthrough. It is desirable to use spray-puddle processes as they permit the conservative use of more expensive, developers, such as Tetramethylammonium Hydroxide, rather than Sodium or Potassium Hydroxide, which can contaminate the wafer. In addition spray-puddle processes generally provide a more uniform development. As geometries get smaller, process latitude could be increased by diluting the developer, however the diluted developer tends to run out of active chemicals before the develop is complete. Thus multiple spray-puddle periods are used as a way of replenishing the developer. However attempts to use endpoint control devices within processes which include double or triple spray puddle stages, i.e. spray-puddle-spray-puddle or spray-puddle-spray-puddle-spray-puddle, have been generally unsuccessful because the change from spray to puddle or vice versa frequently occurs at about the same time within the process when breakthrough can be expected and tends to mask the signal. In addition, the change from spray to puddle or vice versa sometimes significantly changes the reflectivity of the wafer and such reflectance can be read as a false breakthrough point or prevent the detection of the real breakthrough point.

Various methods have been used to overcome the problems described above. For example, a constant spray process using a specialized low volume ultrasonic spray nozzle has been utilized. In one approach a multi-step detection process, changing steps whenever the process changes from spray to puddle or vice versa has been employed. Attempts have been made to overprocess based upon a percentage of step time or a percentage of the recipe time, however this approach only works if breakthrough occurs within finite time limits within a spray or puddle, and may require undesirable modification of the development process to meet the endpoint controller's requirement. In another approach the practice has been to increase the dynamic range of the endpoint controller to include both spray and puddle without changing steps. This method suffers when used with wafers where a small percentage of the wafer area has been exposed, as the signal cannot be both enlarged enough to see changes in the signal and also retain both the spray and the puddle signals on the monitor screen of the endpoint controller. Neither method solves the problem of missing breakthrough, if breakthrough occurs during a change from spray to puddle or vice versa, or the problem of reading a change as a false breakthrough point. Furthermore, none of these methods have been found to improve critical dimension uniformity, from wafer to wafer, enough to warrant the necessary recalibration of the process.

As a result of the above described problems, endpoint control of the develop process has been limited to those processes using immersion develop or track develop with either constant spray or a single spray-puddle step with a short spray. Since approximately 50% or more of existing track develop applications involve a multiple spray-puddle step, it is highly desirable to have an endpoint controlled development process which is useful with multiple spray-puddle steps. It is thus the primary object of this invention to provide a method for using process changes, including breakthrough detection, that is applicable to multiple spray-puddle photoresist develop applications and allows the operator or equipment to decide in real time when to go from puddle to spray and vice versa.

It is well known that wafers are not uniform from wafer to wafer. Because of this lack of uniformity, a system which uses fixed times to control the length of spray and puddle steps within a develop process cannot provide consistent development and thus perpetuates nonuniformity.

As discussed above, a problem with using endpoint detection to control spray-puddle processes, is the commonly occurring coincidence in time of breakthrough with a transition from spray to puddle. A simplistic solution to this problem would suggest that the process times be adjusted to avoid the anticipated time of breakthrough. However, the develop steps and the timing of such steps, are merely parts of a whole process, the design of which has been determined, both scientifically and empirically to provide an acceptable yield. If changes are made in the lengths of the times of the interim steps, the entire process would have to be recharacterized and the critical dimensions reanalyzed and recalibrated. For example, change in develop time will change the linewidth, an important critical dimension. An overall goal of fabricators in this field is to hold everything constant and thus proposals to change develop times are generally deemed to be undesirable. It is another object of this invention to provide a method for scientific, rather than empirical, control of interim process times during the develop process. Furthermore it is an object of this invention that the improvement of critical dimensions by the adjustment of process times be of sufficient magnitude to justify recharacterization of the process and recalibration of the critical dimensions.

In the develop stage of the photolithographic process, endpoint controllers have been used to determine breakthrough and to adjust the total develop time based upon the time to breakthrough. After breakthrough, the process is commonly allowed to continue for a period called overprocess or overdevelop. During this period, the area of breakthrough is widened and the reaction continues to complete the developing process along the sidewalls of the etched area. It is submitted that the point at which the area of breakthrough is widened and the horizontal development is completed is, in fact the end of the development process and within the develop stage of semiconductor fabrication more accurately called the endpoint and the term will be used accordingly herein.

Heretofore there has been no recognition that endpoint control devices could be used to control portions of the develop process other than the total process time. It is thus another object of this invention to control not only the total develop time, but the interim development stages of the develop process so that the range of variations will be narrowed and will more proximately approach the target or center of the critical dimensions range.

It is axiomatic that the more accurately the process is controlled the more likely it is that the resulting product will be within the critical dimensions and that the yield will be improved. Current develop practice is to select a constant total time and within that total time to empirically select constant times to switch from spray to puddle and from puddle to spray. It is still another object of this invention to teach a develop process wherein variable spray and puddle times are used.

Presently, the total time is the critical parameter used by fabricators. In processing according to our invention, neither the final time nor the interim times are critical. At a point when either a puddle reaches breakthrough or when the chemicals require replenishment, spray begins. Thus interim and total develop times are determined using factors other than time alone, such as the following process changes; percent of time to breakthrough, rate of develop, dissolution rate or chemical depletion rates. A further object of this invention is to find breakthrough and control spray-puddle cycles, independently from the total time of the develop process.

Pertinent references related to endpoint detection of photoresist development include the following: U.S. Pat. No. 4,462,860, End Point Detection, issued Jul. 31, 1984 to Charles R. Szmanda; U.S. Pat. No. 4,501,480, System for Developing a Photo-Resist Material used as a Recording Medium, issued Feb. 26, 1985 to Matsui et al; U.S. Pat. No. 4,647,172, Resist Development Method, issued Mar. 3, 1987 to Batchelder et al; and U.S. Pat. No. 4,136,940, issued Jan. 30, 1979 to Lin.

SUMMARY OF THE INVENTION

This invention teaches the use of a combination of process changes, including, but not limited to breakthrough, to determine the length of spray and puddle steps within photo-resist develop processes in general and particularly in such processes employing multiple spray-puddle steps. At the option of the operator, time may be used in combination with the process steps to determine the length of the steps. Endpoint analysis discloses that the develop process consists of two distinct phases. The first is the time to breakthrough, where the development action is mostly vertical. The second is the over process time, where the development action is mostly lateral. In prior art practice replenishment is usually arbitrarily set about midway through the process. Unfortunately, breakthrough usually occurs at about the same time. For this reason scientific control, rather than arbitrary setting of the length of process steps is required.

In photolithographic processing it is difficult, if not impossible to control the variations from wafer to wafer. In any processing of wafers, the time to breakthrough from wafer to wafer may differ by several seconds within a single run.

In accordance with the prior discussion, a major reason for multiple spray-puddle steps is to replenish the depleted chemicals. During the period while the chemicals are being depleted, the concentrations of such chemicals are proportionately reduced. The rate of development is greatly affected by the depletion of the chemicals. As a result it is highly desirable that the point within the development stage at which the chemicals are replenished be as consistent as possible to improve wafer to wafer uniformity and to assure compliance with critical dimensions. The system of this invention permits the replenishment of chemicals in general at the exact same development stage of the process and in particular at the exact same stage in relation to when the process changes from vertical development to lateral development. In the current state of the art, it is recognized that endpoint control is useful in develop processes having a constant spray step and in processes having a short single spray step and a single puddle step. A short spray step is one where the spray consistently ends before breakthrough. The reason that endpoint control has been found to be useful in short spray-puddle processes is that if the spray step consistently ends prior to breakthrough it does not obscure the endpoint. It is generally believed that endpoint control is less useful in multiple spray-puddle processes because endpoint often occurs at the time of transition from spray to puddle or vice versa and thus is only reliable in those cases where breakthrough misses the transition period. In those cases where breakthrough occurs at the transition time endpoint detection is unreliable because of masking of the signal or false endpoint readings. This invention overcomes those problems.

Furthermore, by using an endpoint controller to control the steps within the develop stage, breakthrough can be detected on every wafer, not just those whose timing fortuitously happens not to conflict with the change from puddle to spray or vice versa.

In an embodiment of this invention, an endpoint controller is interfaced to a single-wafer develop/etch module so that the endpoint controller detects significant process changes and the operator or control equipment may decide when to change from spray to puddle and vice versa. The endpoint controller can use a number of indicators, singly and in combination, to detect process changes. The process changes which then may be used as indicators for changing from spray to puddle and vice versa include, but are not limited to, time, breakthrough, dissolution rate, chemical depletion rate, number of peaks and/or valleys in the reflected signals, rising or falling signals, or passing of signals through predetermined thresholds.

The communication interface between the endpoint controller and the process equipment may be commonly available TTL logic, fiber optics, or computer links such as the RS232 standard.

DETAILED DESCRIPTION OF THE INVENTION

Figure 1:
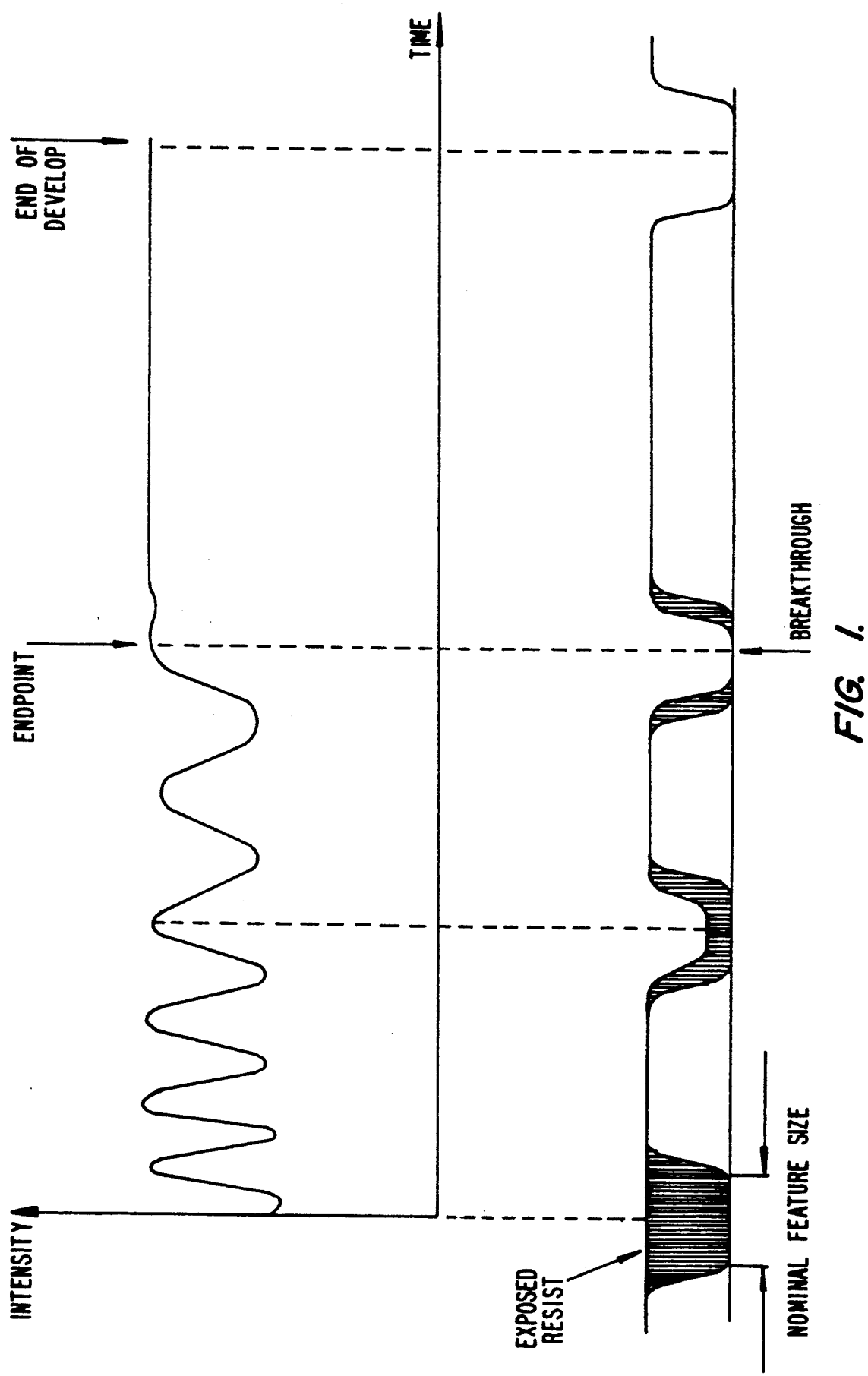
FIG. 1 is a graph of the resultant signal derived from light reflected from both the surface of photoresist and the underlying substrates.
Figure 2:
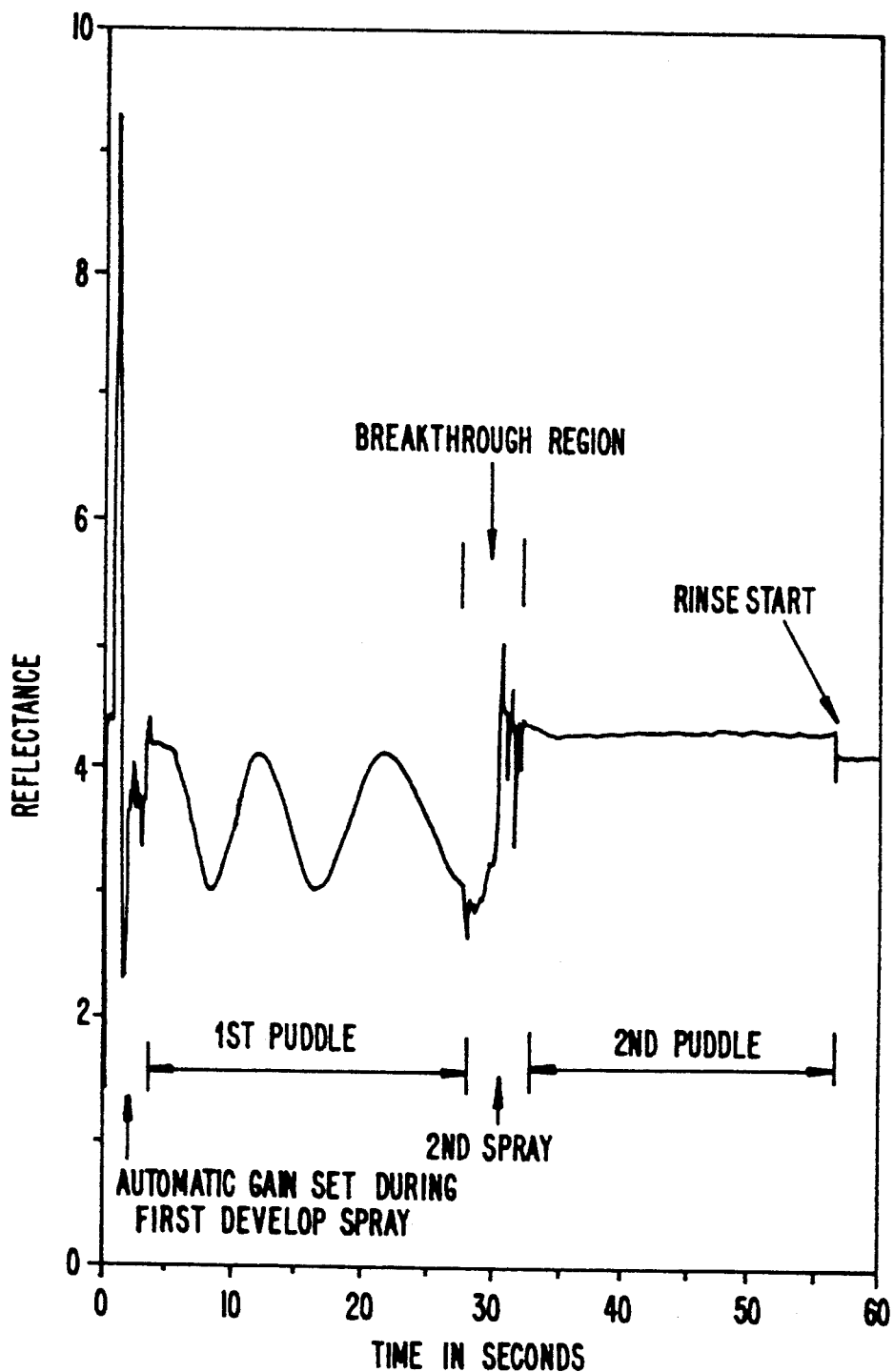
FIG. 2 is a graph illustrating breakthrough obscured by spray-puddle transitions.
Figure 3:
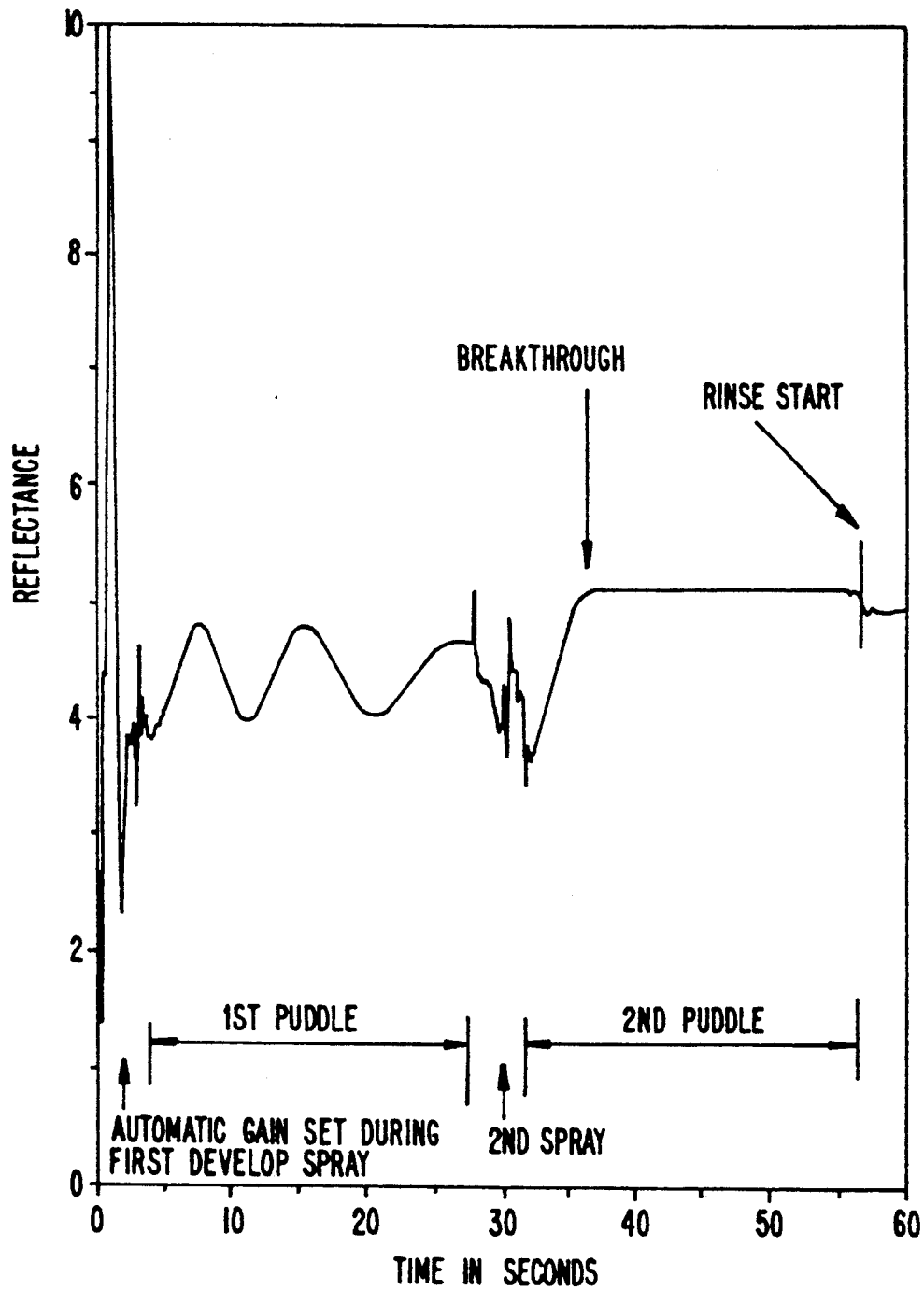
FIG. 3 is a graph illustrating breakthrough after spray-to-puddle transition.
Figure 4:
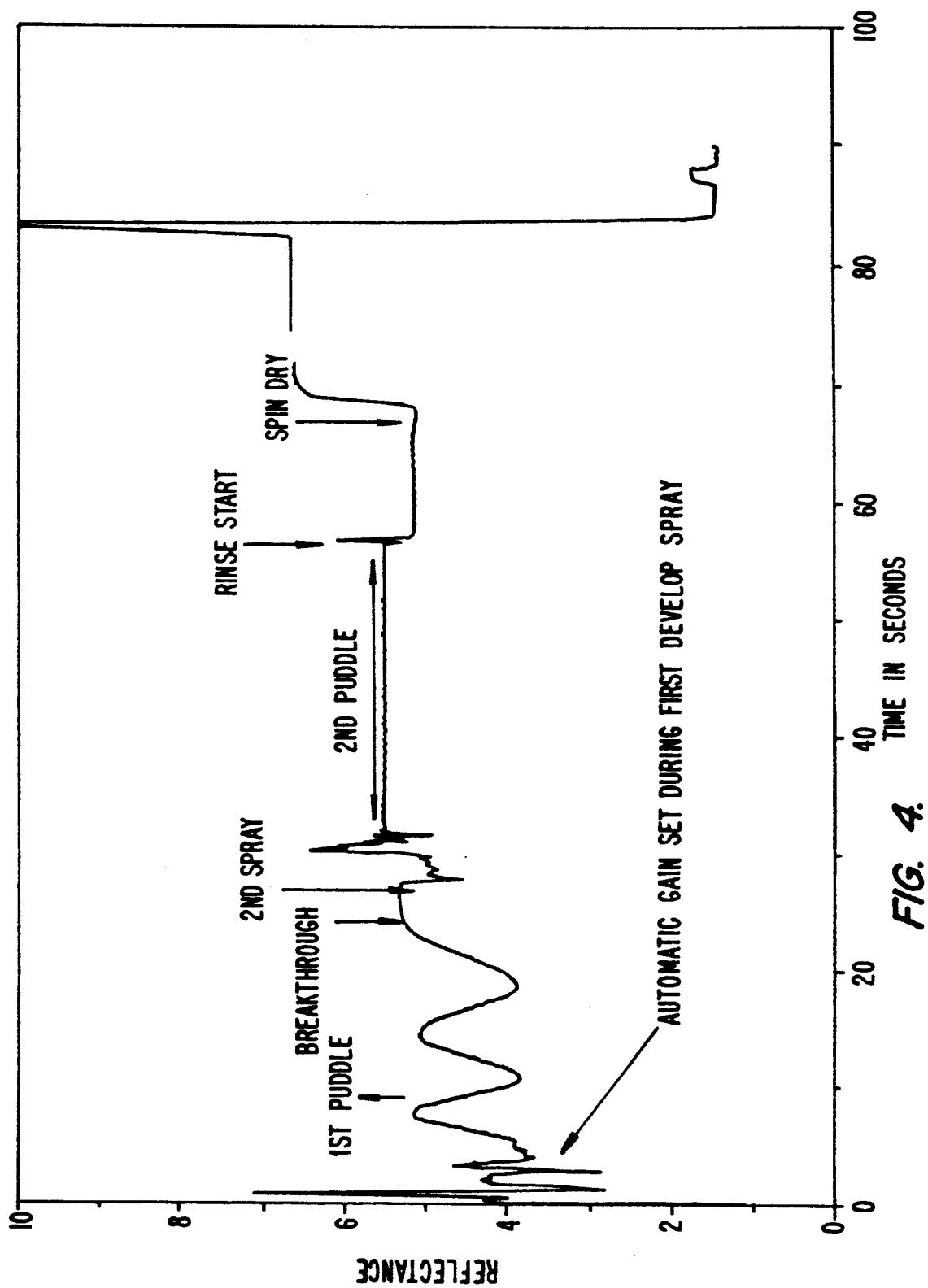
FIG. 4 is a graph illustrating breakthrough before puddle-to-spray transition.
Figure 5:
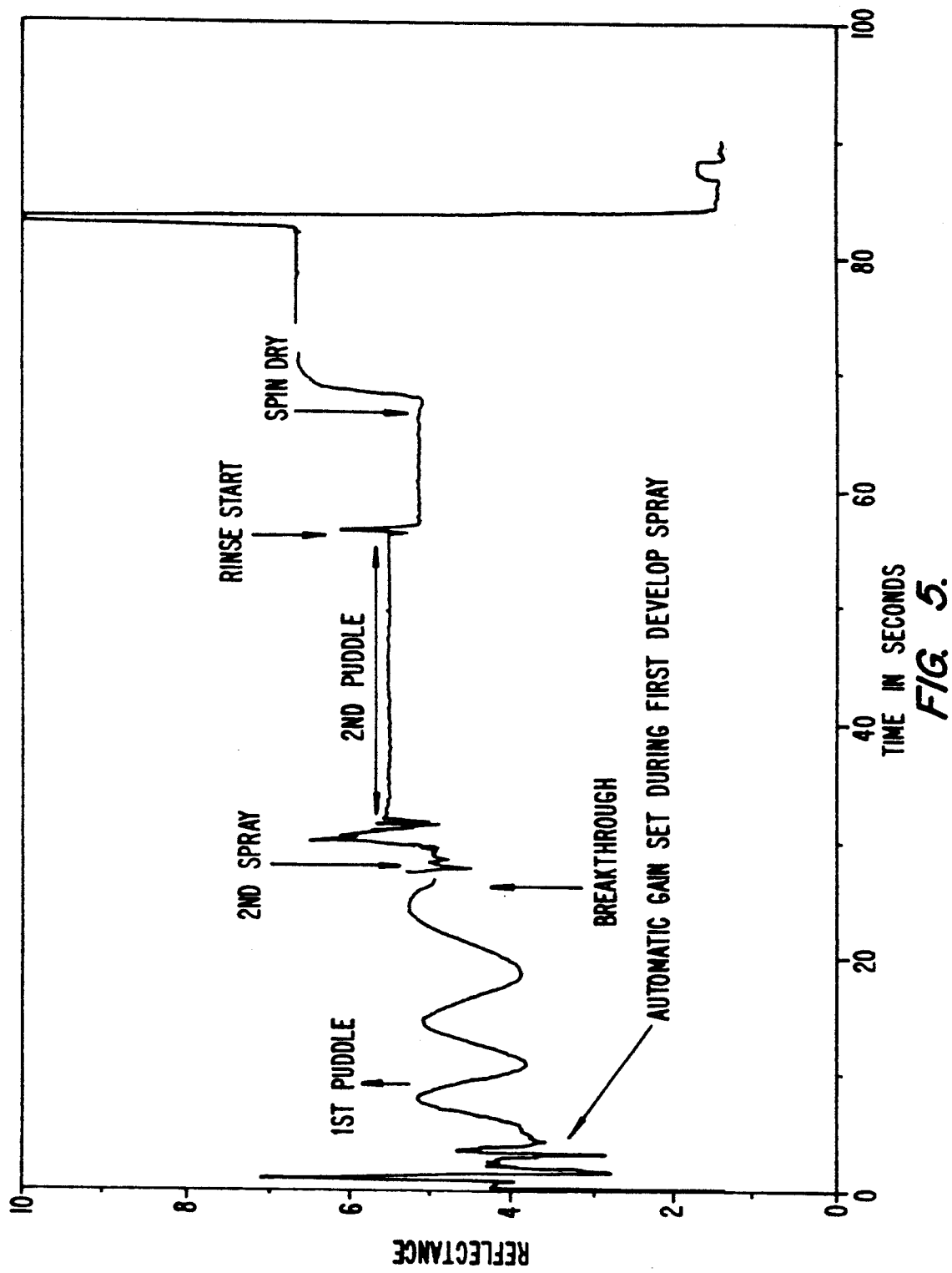
FIG. 5 is a graph illustrating the use of breakthrough to control transition from puddle to spray

The practice of the invention may be better understood by the following specific example of a double spray-puddle develop process within a single wafer photoresist/etch module. Light is directed upon the surface of a wafer within any track or immersion develop system and the intensity of the reflected light is monitored. The light is reflected from both the surface of the photoresist and also from the underlying substrates. As the photoresist develops, and the photoresist thickness is reduced in the developing area, the path length of the light traveling through the resist lessens, changing the wave phase as it re-emerges from the photoresist. The two reflected waves cycle between being completely in phase to being completely out of phase. The intensity of the reflected light cycles between maximum and minimum levels as the waves constructively, then destructively, add together with the phase changes. The resulting signal is a typical sine wave as shown in FIG. 1. When the developer breaks through to the underlying substrate, the path lengths of the two reflected waves no longer differ and the signal goes flat. The point where the signal goes flat and the developer breaks through to the underlying substrate is the "breakthrough point" of the develop process. Because of the diffraction of the exposure light as it passes through the mask, the photoresist sees differing levels of exposure energy at the feature edges. This causes the edges of the feature to develop more slowly than the center. Breakthrough typically occurs about half way through the develop cycle. The remaining time, or overprocess time, is needed to widen the feature to the nominal target dimension. The exact overprocess time varies with process conditions. As an example, a forty-four(44) second total develop time is used. The develop process begins with two seconds of spray develop, twenty seconds of puddle develop, two seconds of spray develop, and a final twenty seconds of puddle develop. This is typically followed by thirty seconds of rinse, and thirty seconds of drying. Breakthrough can typically occur anywhere from eighteen to twenty-six seconds into the process. If breakthrough occurs at eighteen seconds, then chemical replenishment occurs 4 seconds after breakthrough. On the otherhand if breakthrough occurs at twenty-six seconds then chemical replenishment occurs 4 seconds before breakthrough. Since the total development time is fixed at 44 seconds, overprocess is twenty-six seconds or 144% of breakthrough time in the first case and eighteen seconds, or 69% of breakthrough time in the second case. The critical dimension would be substantially different in these two cases.

Using an endpoint controller, controlling develop-stop-rinse-start only, set for 100% over-process, end point time and over-process time would both be eighteen seconds for the first case. Total development time would be thirty-six seconds. Chemical replenishment would still occur four seconds after end point. The wafer would be exposed to the fresh chemical for fourteen seconds.

In the second case, using the same settings for the endpoint controller, endpoint time and overprocess time would both be for twenty-six seconds for a total develop time of fifty-two seconds. Chemical replenishment would occur four seconds before endpoint. The wafer would be exposed to the fresh chemical for thirty seconds, or more than twice as long as in the first case. Calculating the over-process time as a function of breakthrough time is not instructive, because of the addition of fresh chemicals at an inconsistent time in relation to the process. While critical dimensions would be somewhat improved due to a customized develop time, significant differences in critical dimensions would remain, due to the large difference in the time of chemical replenishment.

In the practice of our invention, the endpoint controller would be used to control all of the develop times, and would be represented as follows:

| Case 1 (Breakthrough occurs at 18 seconds) | | |
|---|---|---|
| Spray 1 | 2 seconds | (controlled by time) |
| Puddle 1 | 16 seconds | (controlled by breakthrough) |
| Spray 2 | 2 seconds | (controlled by time) |
| Puddle 2 | 16 seconds | (100% of Puddle 1) |
| | Total develop time = 36 seconds | |
| Case 2 (Breakthrough occurs at 26 seconds) | | |
| Spray 1 | 2 seconds | (controlled by time) |
| Puddle 1 | 24 seconds | (controlled by breakthrough) |
| Spray 2 | 2 seconds | (controlled by time) |
| Puddle 2 | 24 seconds | (100% of Puddle 1) |
| | Total develop time = 52 seconds | |

In both of the cases of this example, chemical replenishment occurs immediately after endpoint is reached, and just as overprocess begins. Both the mostly vertical and the mostly lateral develop steps begin with fresh developer, so calculating one time as a function of the other time is instructive. In this situation, the critical dimensions will be as close as would be expected in an equivalent constant spray or single spray-puddle process using endpoint control.

It is not new to use an endpoint controller to control the total develop time, and thus it would be obvious to use the time function of an endpoint controller to control some steps of such a process. The use of the endpoint function or another function other than time, such as breakthrough points, dissolution rate or chemical depletion rate to control various steps within the develop process is novel and represents a significant improvement in the control of critical dimensions and in the use of endpoint control devices (such as the Xinix Model 2300) for complex processes.

This invention has been described within the context of controlling spray-puddle processes within the develop stage of semiconductor fabrication. The invention is not so limited and is useful in other processes, such as the etch stage of semiconductor fabrication.

I claim:

1. A method of developing a layer of photoresist material, comprising the steps of:
   commencing application of a developer solution onto the photoresist layer,
   monitoring the development process in a manner to determine when the photoresist layer is first developed completely therethrough,
   changing, while still continuing, the developing process in direct response to said determination, and
   terminating action of the developer solution on the photoresist layer at a controlled time after the photoresist layer is first developed completely therethrough, whereby the photoresist development is completed after said controlled time.

2. The method according to claim 1 wherein the step of commencing application of developer solution onto the photoresist layer includes spraying developer solution thereon.

3. The method according to either of claims 1 or 2 wherein the monitoring step includes the steps of:
   directing light against the photoresist layer, thereby to result in light reflected therefrom, and
   determining when the photoresist layer is first developed completely therethrough by observing the reflected light.

4. The method according to either of claims 1 or 2 wherein the monitoring step includes the steps of:
   observing a time variation of an intensity of an interference pattern in light reflected from the photoresist layer and a surface thereunder, and
   determining when the photoresist layer is first developed completely therethrough by observing when said light intensity time variation ends.

5. The method according to either of claims 1 or 2 wherein said photoresist layer has been exposed to an optical pattern prior to the application of a developer solution thereto, whereby the photoresist layer is developed completely therethrough in accordance with said optical pattern.

6. The method according to either of claims 1 or 2 wherein the terminating step includes the step of rinsing the developer solution from the photoresist layer.

7. The method according to either of claims 1 or 2 wherein said photoresist material layer is carried by a semiconductor substrate.

8. A method of developing a layer of photoresist material, comprising the steps of:
   commencing application of a developer solution onto the photoresist layer,
   monitoring the development process in a manner to determine when the photoresist layer is first developed completely therethrough,
   initiating, in direct response to said determination, an application of fresh developer solution onto the photoresist layer, and
   terminating action of the developer solution on the photoresist layer at a controlled time after the photoresist layer is first developed completely therethrough, whereby the photoresist development is completed after said controlled time.

9. The method according to claim 8 wherein the step of commencing application of developer solution onto the photoresist layer includes spraying developer solution thereon.

10. The method according to either of claims 8 or 9 wherein the monitoring step includes the steps of:
    directing light against the photoresist layer, thereby to result in light reflected therefrom, and
    determining when the photoresist layer is first developed completely therethrough by observing the reflected light.

11. The method according to either of claims 8 or 9 wherein the monitoring step includes the steps of:
    observing a time variation of an intensity of an interference pattern in light reflected from the photoresist layer and a surface thereunder, and
    determining when the photoresist layer is first developed completely therethrough by observing when said light intensity time variation ends.

12. The method according to either of claims 8 or 9 wherein said photoresist layer has been exposed to an optical pattern prior to the application of a developer solution thereto, whereby the photoresist layer is developed completely therethrough in accordance with said optical pattern.

13. The method according to either of claims 8 or 9 wherein the terminating step includes the step of rinsing the developer solution from the photoresist layer.

14. The method according to either of claims 8 or 9 wherein said photoresist material layer is carried by a semiconductor substrate.

* * * * *